(12) United States Patent
Lee et al.

(10) Patent No.: US 9,041,124 B2
(45) Date of Patent: May 26, 2015

(54) SEMICONDUCTOR MEMORY DEVICE AND METHOD OF MANUFACTURING THE SAME

(71) Applicant: SK hynix Inc., Gyeonggi-do (KR)

(72) Inventors: Yun Kyoung Lee, Seoul (KR); Jung Ryul Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 13/716,027

(22) Filed: Dec. 14, 2012

(65) Prior Publication Data

US 2014/0048890 A1 Feb. 20, 2014

(30) Foreign Application Priority Data

Aug. 16, 2012 (KR) .................. 10-2012-0089578

(51) Int. Cl.
*H01L 29/06* (2006.01)
*H01L 21/8234* (2006.01)
*H01L 27/088* (2006.01)
*H01L 21/762* (2006.01)
*H01L 21/28* (2006.01)
*H01L 29/423* (2006.01)
*H01L 29/66* (2006.01)
*H01L 29/788* (2006.01)
*H01L 27/115* (2006.01)
*H01L 21/76* (2006.01)
*H01L 21/84* (2006.01)
*H01L 27/12* (2006.01)

(52) U.S. Cl.
CPC .......... *H01L 29/0649* (2013.01); *H01L 27/088* (2013.01); *H01L 21/823481* (2013.01); *H01L 21/76* (2013.01); *H01L 21/76229* (2013.01); *H01L 21/28273* (2013.01); *H01L 29/42336* (2013.01); *H01L 29/66825* (2013.01); *H01L 29/7881* (2013.01); *H01L 27/11521* (2013.01); *H01L 21/845* (2013.01); *H01L 27/1211* (2013.01)

(58) Field of Classification Search
CPC .................. H01L 27/10876; H01L 21/76224; H01L 21/76232; H01L 27/11524; H01L 29/1083; H01L 21/76283; H01L 29/0692; H01L 27/76; H01L 21/76229; H01L 27/10823
USPC ......................................... 257/390, 347, 204
See application file for complete search history.

(56) References Cited

U.S. PATENT DOCUMENTS

2011/0316091 A1* 12/2011 Taylor et al. .................. 257/390

FOREIGN PATENT DOCUMENTS

| KR | 1020090074539 | | 7/2009 | |
|---|---|---|---|---|
| KR | 1020090099407 | | 9/2009 | |
| KR | 1020090099407 | A * | 9/2009 | .............. H01L 29/78 |

* cited by examiner

*Primary Examiner* — Tom Thomas
*Assistant Examiner* — John Bodnar
(74) *Attorney, Agent, or Firm* — IP & T Group LLP

(57) ABSTRACT

A semiconductor memory device and a method of manufacturing the same are provided. The device includes a semiconductor substrate in which active regions and isolation regions are alternately defined, and a support region is defined in a direction crossing the active regions and the isolation regions, first trenches formed in the isolation regions, second trenches formed under the first trenches in the active regions and the isolation regions; and a support layer formed under the first trenches in the support region.

7 Claims, 7 Drawing Sheets

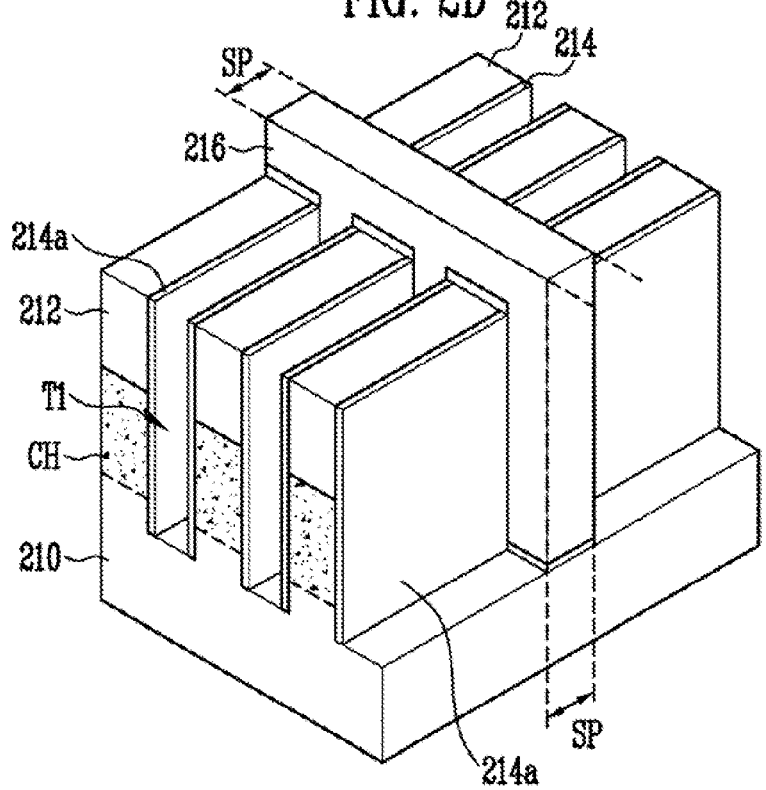
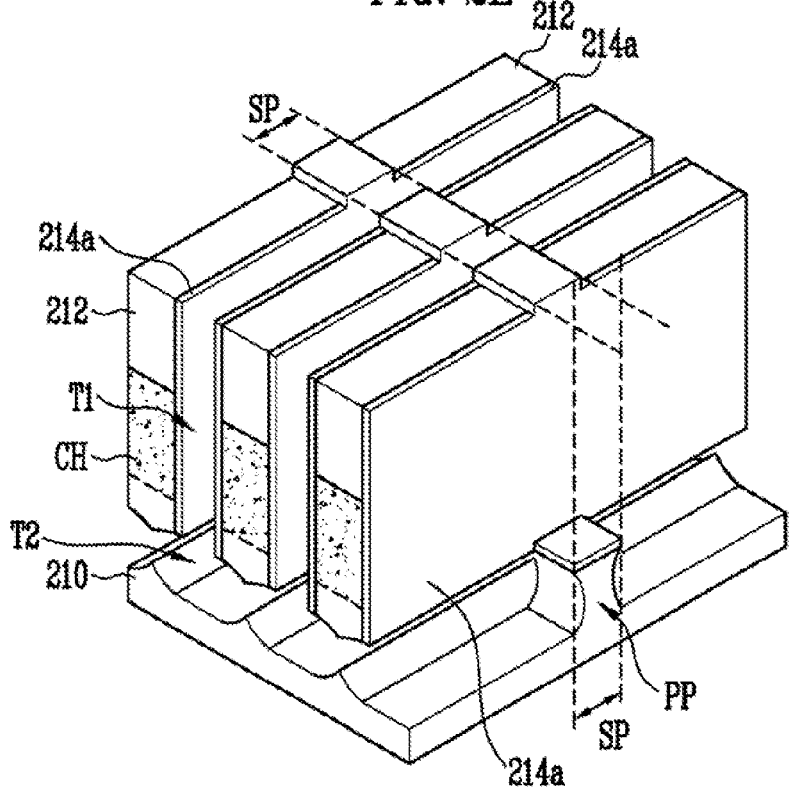

SEMICONDUCTOR MEMORY DEVICE AND METHOD OF MANUFACTURING THE SAME

CROSS-REFERENCE TO RELATED APPLICATION

This application claims priority to and the benefit of Korean Patent Application No. 10-2012-0089578, filed on Aug. 16, 2012, the disclosure of which is incorporated herein by reference in its entirety.

BACKGROUND

Exemplary embodiments of the present invention relate to a semiconductor memory device and a method of manufacturing the same. More specifically, the exemplary embodiments of the present invention relate to an isolation region of a semiconductor memory device.

DISCUSSION OF RELATED ART

A semiconductor memory device may include a plurality of active regions and a plurality of isolation regions.

Memory cells or transistors may be formed on the active regions of the semiconductor substrate, while trenches configured to electrically isolate the active regions from one another may be formed in the isolation regions of the semiconductor substrate. The trenches may be filled with an insulating material or air gaps that may be formed within the trenches.

Meanwhile, with an increase in the integration density of semiconductor memory devices, the widths and pitches of active regions and isolation regions tend to decrease. Thus, even if trenches are formed in the isolation regions of a semiconductor substrate, current leakage may occur between the active regions.

For example, in a NAND flash memory device, a plurality of memory cells may be connected to each of word lines, and isolation layers defined by device isolation regions may be formed between active regions of a semiconductor substrate, which the memory cells are formed. During a program operation, memory cells to be programmed and memory cells not to be programmed may be connected to a selected word line to which a program voltage is supplied. Since a program allowance voltage (e.g., about 0 V) is supplied to a channel of each of the memory cells to be programmed, electrons may be tunneled from the channel to a floating gate due to a voltage difference between the channel and the word line so that the corresponding memory cells may be programmed. In contrast, by supplying a program inhibition voltage (e.g., a power supply voltage) to a channel of each of the memory cells not to be programmed, an electric potential of the channel may become higher than the program inhibition voltage due to channel boosting. Thus, since a difference in electric potential between the channel and the word line becomes very low electrons may not be tunneled to floating gates of the corresponding memory cells.

However, when leakage current occurs between active regions in which the memory cells not to be programmed and active regions in which the memory cells to be programmed are formed, a channel potential of the active regions in which the memory cells not to be programmed are formed may be reduced. As a result, a difference in electrical potential between the channel and the word line may increase, so even the memory cells not to be programmed may be programmed. Performing an undesired operation may be referred to as a disturbance. In particular, in a multi-level cell in which a single memory cell may be programmed in a plurality of states, since a voltage difference between threshold voltage distributions in different states is very low, when disturbance occurs, reliability may be sharply degraded.

SUMMARY OF THE INVENTION

Exemplary embodiments of the present invention are directed to a semiconductor memory device and a method of manufacturing the same, which may prevent leakage between active regions isolated by isolation regions.

One aspect of the embodiment of the present invention provides a semiconductor memory device including a semiconductor substrate in which active regions and isolation regions are alternately defined, and a support region is defined in a direction crossing the active regions and the isolation regions, first trenches formed in the isolation regions, second trenches formed under the first trenches in the active regions and the isolation regions; and a support layer formed under the first trenches in the support region.

Another aspect of the embodiment of the present invention provides a method of manufacturing a semiconductor memory device, including forming a channel region by implanting ions into a semiconductor substrate in which active regions and isolation regions are defined, and a support region is defined in a direction crossing the active regions and isolation regions; formed; forming first trenches in the isolation regions, and forming second trenches under the first trenches in the active regions and isolation regions excluding the support region.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 2A through 2J are perspective views illustrating a method for manufacturing a semiconductor memory device according to a first exemplary embodiment of the present invention;

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein. Rather, these exemplary embodiments are provided so that this disclosure is thorough and complete and fully conveys the scope of the present invention to one skilled in the art. It should be readily understood that the meaning of "on" and "over" in the present disclosure should be interpreted in the broadest manner such that "on" not only means "directly on" something but also include the meaning of "on"

something with an intermediate feature or a layer therebetween and that "over" not only means the meaning of "over" something may also include the meaning it is "over" something with no intermediate feature or layer therebetween (i.e., directly on something). In this specification, 'connected' represents that one component is directly coupled to another component. Also, a singular form may include a plural form as long as it is not specifically mentioned in a sentence.

Figure 1:
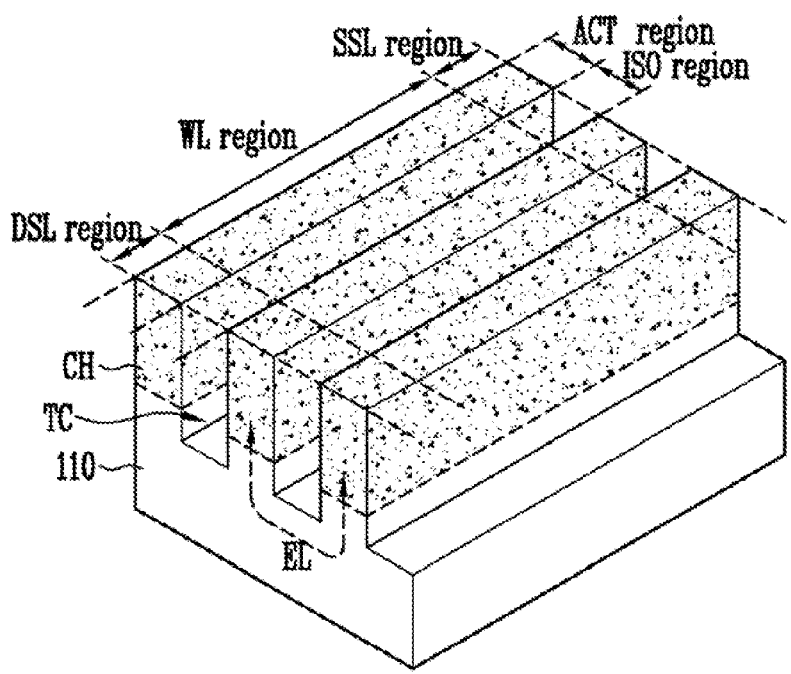
FIG. 1 is a perspective view illustrating an occurrence of leakage in a semiconductor substrate.

FIG. 1 is a perspective view illustrating an occurrence of leakage in a semiconductor substrate.

Referring to FIG. 1, in a NAND flash memory device, doped channel regions CH may be formed in a semiconductor substrate 110 in which active regions ACT are defined, and isolation trenches TC may be formed in the semiconductor substrate 110 in which isolation regions ISO are defined. The trenches TC may be formed to have a greater depth than the channel regions CH so that the channel regions CH formed in different active regions ACT may be electrically isolated from one another. If the active regions ACI and the isolation regions ISO are arranged in one direction, a drain select region DSL, a word line region WL, and a source select region SSL may be defined on the semiconductor substrate 110 and arranged in the other direction crossing the one direction. Although not shown in FIG. 1, a drain select transistor may be formed on the drain select region DSL of the semiconductor substrate 101, a plurality of word lines may be formed on the word line region WL of the semiconductor substrate 110, and a source select transistor may be formed on the source select region SSL of the semiconductor substrate 110. Channel regions CH in each of the drain select regions DSL may be isolated from one another by the trenches CT, channel regions CH of the word line region WL may be isolated from one another by the trenches TC, and channel regions CH of the source select region SSL may be isolated from one another by the trenches TC. However, since lower portions of the trenches TC near the semiconductor substrate 110 are electrically connected to lower portions of the channel regions CH by the semiconductor substrates 110, electrons EL may be transported through the semiconductor substrate 110 disposed under adjacent channel regions CH during operations of the semiconductor memory device, thereby causing a leakage current.

Thus, in the exemplary embodiment of the present invention, to cut off a transport path of the electrons EL at which a leakage current may occur, bulb-shaped trenches may be further formed under the trenches TC. In particular, the transport of the electrons EL under the channel regions CH may be prevented by overlapping the bulb-shaped trenches. Specific manufacturing methods and structures will now be described.

FIGS. 2A through 2J are perspective views illustrating a method of manufacturing a semiconductor memory device according to a first exemplary embodiment of the present invention.

Figure 2A:
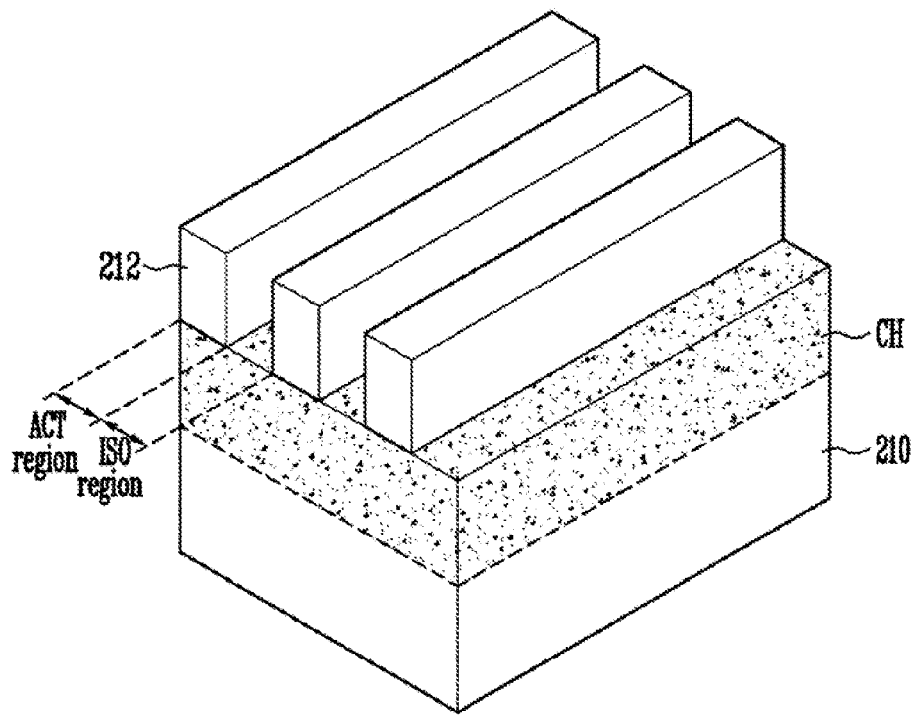

Referring to FIG. 2A, channel regions CH may be formed in a semiconductor substrate 210 using an ion implantation. First hard mask patterns 212 may be formed on the semiconductor substrate 210 having the channel regions CH. Specifically, the first hard mask patterns 212 may be formed on the active regions ACT of the semiconductor substrate 210 to form first trenches in the isolation regions ISO of the semiconductor substrate 210. That is, the first hard mask patterns 212 may include patterns configured to expose the isolation regions ISO of the semiconductor substrate 210. The first hard mask patterns 212 may be formed using an oxide layer, a nitride layer, or a conductive layer or formed by stacking at least two layers thereof.

Figure 2B:
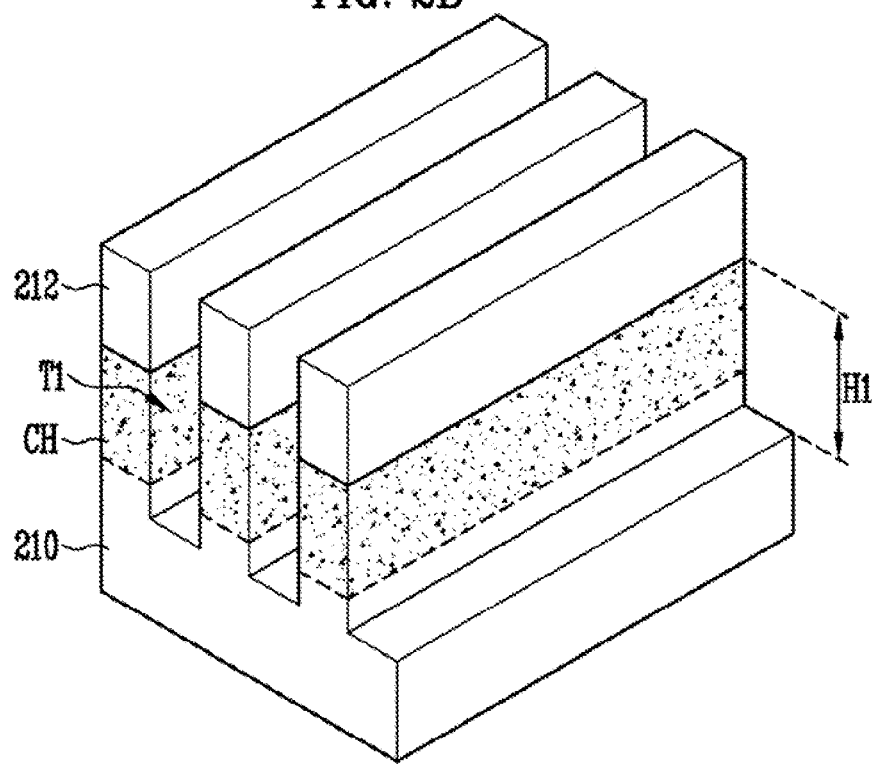

Referring to FIG. 2B, first trenches T1 may be formed in the isolation regions ISO using a first etching process. The first etching process may be performed using a dry etching process. To form the first trenches T1 substantially perpendicular to the semiconductor substrate 210, the first etching process may be performed using an anisotropic dry etching process. In addition, the first etching process may be performed such that the first trenches T1 have a depth H1 that is greater than a depth of the channel regions CH.

Figure 2C:
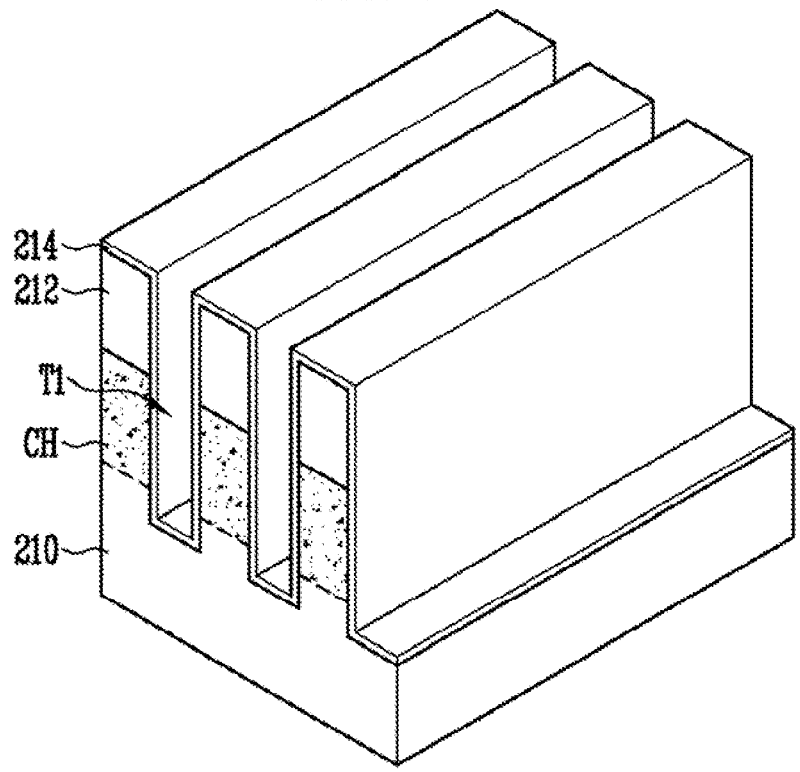

Referring to FIG. 2C, a second hard mask layer 214 may be formed along the surface of the entire structure having the first trenches T1. The second hard mask layer 214 may be formed using an oxide layer, a nitride layer, or a conductive layer or formed by stacking at least two layers thereof.

Referring to FIG. 2D, among the entire structure having the second hard mask layer 214, a third hard mask pattern 216 may be formed in a support region SP defined to support the channel regions CH of the semiconductor substrate 210. Specifically, the third hard mask pattern 216 may be formed in a partial region in which the support region SP overlaps the isolation region ISO. The third hard mask pattern 216 may be formed of a material having an etch selectivity different from the second hard mask layer 214.

After the third hard mask pattern 216 is formed on the second hard mask layer 214 in the support region SP, the second hard mask layer 214 may be removed using a second etching process from planar surfaces of the isolation regions ISO of the semiconductor substrate 210 except for the support region SP. Thus, the second hard mask layer 214 may become second hard mask patterns 214a. The second etching process may be performed such that the second hard mask layer 214 remains on inner sidewalls of the isolation regions ISO and in the support region SP. To this end, the second etching process may be performed using an anisotropic dry etching process.

Referring to FIG. 2E, after the third hard mask pattern 216 is removed, a third dry etching process may be performed using the remaining second hard mask patterns 214a as an etch mask. The third etching process may be performed using an isotropic dry etching process to form second trenches T2 having a bulb shape on bottom surfaces of the first trenches T1. In particular, the third etching process may be performed such that adjacent ones of the second trenches T2 having bulb shapes overlap with each other. That is, the third etching process may be performed to connect the second trenches T2. However, since the second hard mask patterns 214a remain in the support region SP, the second trenches T2 may not be connected to one another in the support region SP. That is, in the support region SP, since the second trenches T2 are not formed but the semiconductor substrate 210 remains, the semiconductor substrate 210 remaining in the support region SP may function as a support layer PP capable of supporting the semiconductor substrate 210 including the channel regions CH partitioned by the first trenches T1. Accordingly, when the support region SP has an excessively small width, the second trenches T2 formed during the third etching process may be connected to one another, so the support layer PP may not be formed. Thus, the third hard mask pattern 216 formed to define the support region SP in FIG. 2D may be formed to a sufficient width not to connect the second trenches T2.

Figure 2F:
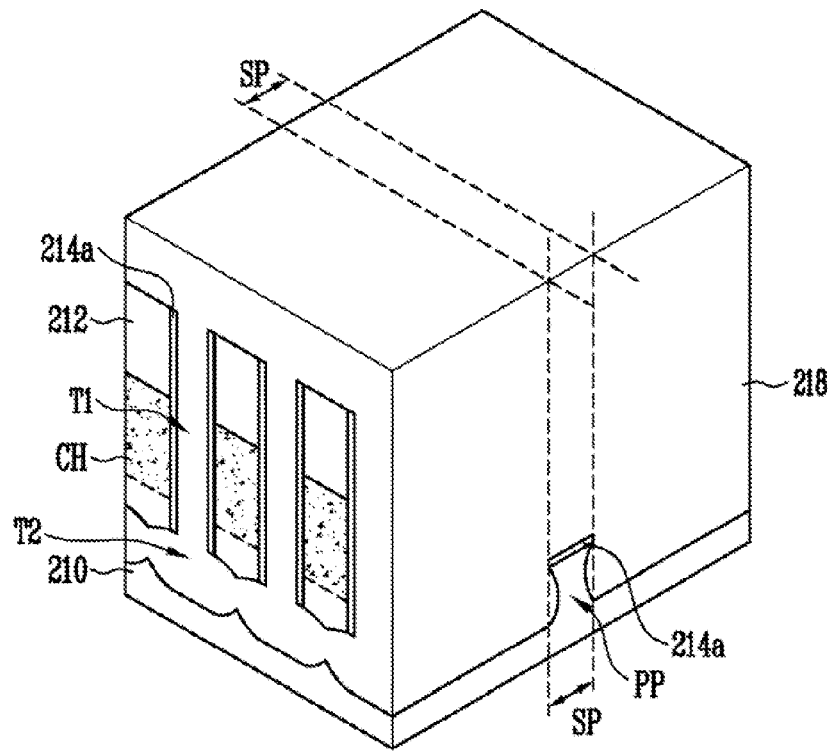

Referring to FIG. 2F, the first and second trenches T1 and T2 may be filled with an isolation layer 218. Specifically, the isolation layer 218 may be formed to fill the first and second trenches T1 and T2 and completely cover the first hard mask patterns 212. For example, the isolation layer 218 may be formed using an oxide layer or a flowable insulating material. If the isolation layer 218 is formed of a flowable insulating material, the flowable insulating material may be spin on glass (SOG). In addition, air gaps may be formed of an insulating material having low step coverage characteristics within the second trenches T2 or within the first and second trenches T1 and T2.

Figure 2G:
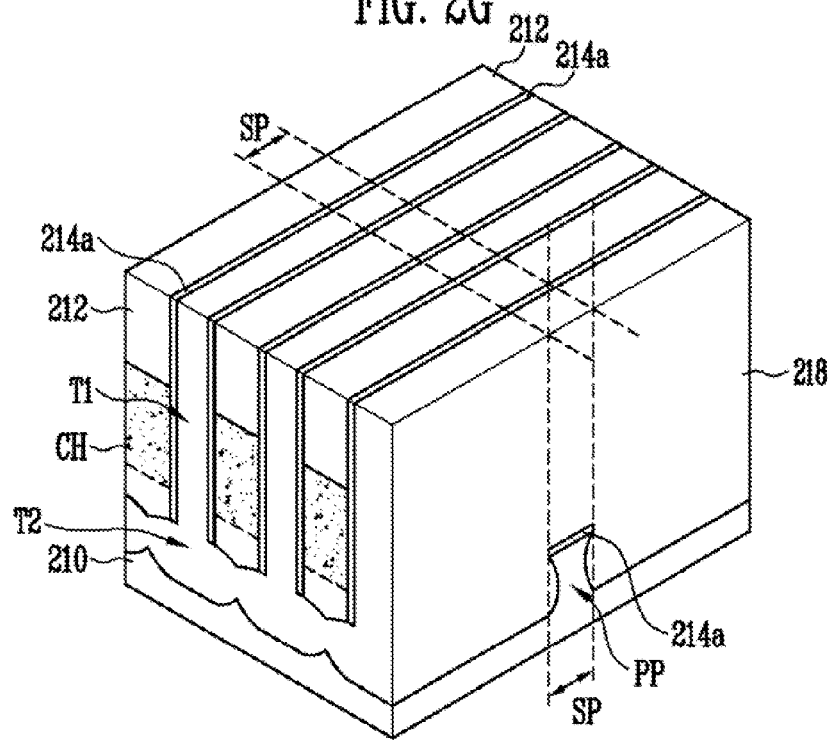

Referring to FIG. 2G, an upper portion over the first hard mask patterns 212 of the isolation layer 218 may be removed using a planarization process, for example, a chemical mechanical polishing (CMP) process. The planarization process may be performed until the first hard mask patterns 212 and the second hard mask patterns 214a are exposed.

Figure 2H:
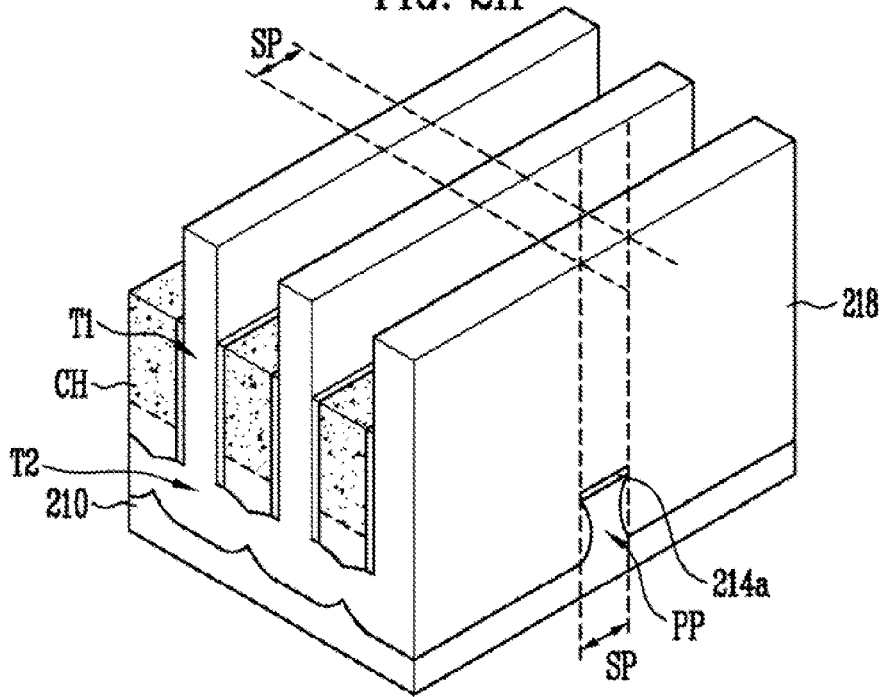

Referring to FIG. 2H, the first hard mask patterns 212 and the second hard mask patterns 214a formed on the channel regions CH may be removed to expose the semiconductor substrate 210 of the channel regions CH and the second hard mask patterns 214a. Thus, an upper portion of the isolation layer 218 may partially protrude from the channel region CH.

Figure 2I:
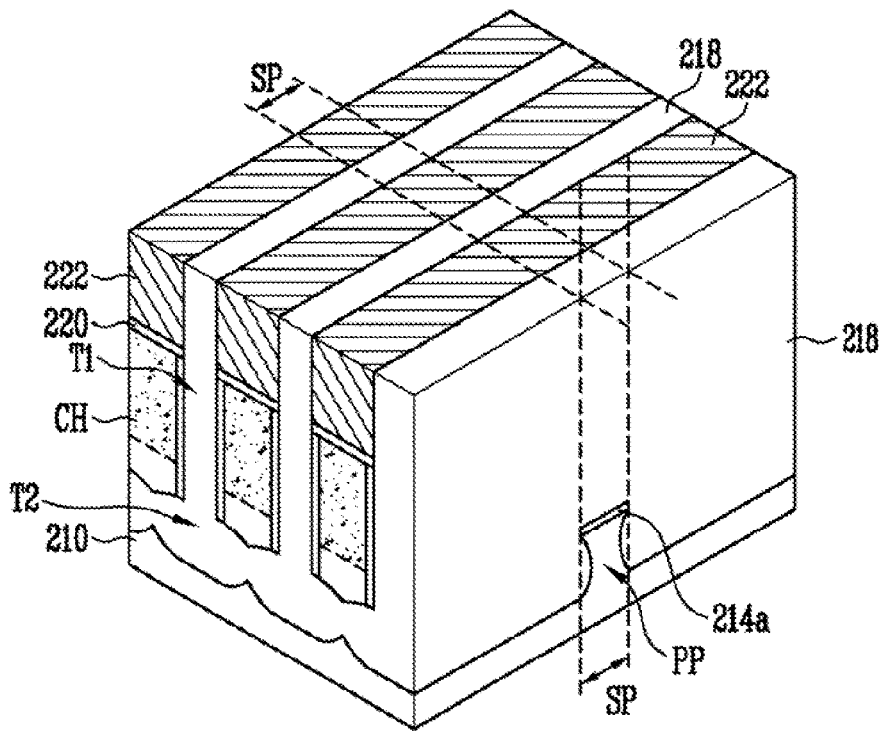

Referring to FIG. 2I, a gate insulating layer 220 and a first conductive layer 222 for a floating gate may be formed on the exposed channel regions CH and second hard mask patterns 214a. For example, the gate insulating layer 220 may be formed using an oxide layer or formed by stacking an oxide layer, a nitride layer, and an oxide layer. The first conductive layer 222 may be formed using a polysilicon (poly-Si) layer. For example, the first conductive layer 222 may be formed using a doped poly-Si layer or formed by stacking an undoped poly-Si layer and a doped poly-Si layer. The first conductive layer 222 may be formed by implanting N-type impurities or N-type impurities according to the characteristics of a memory device.

Figure 2J:
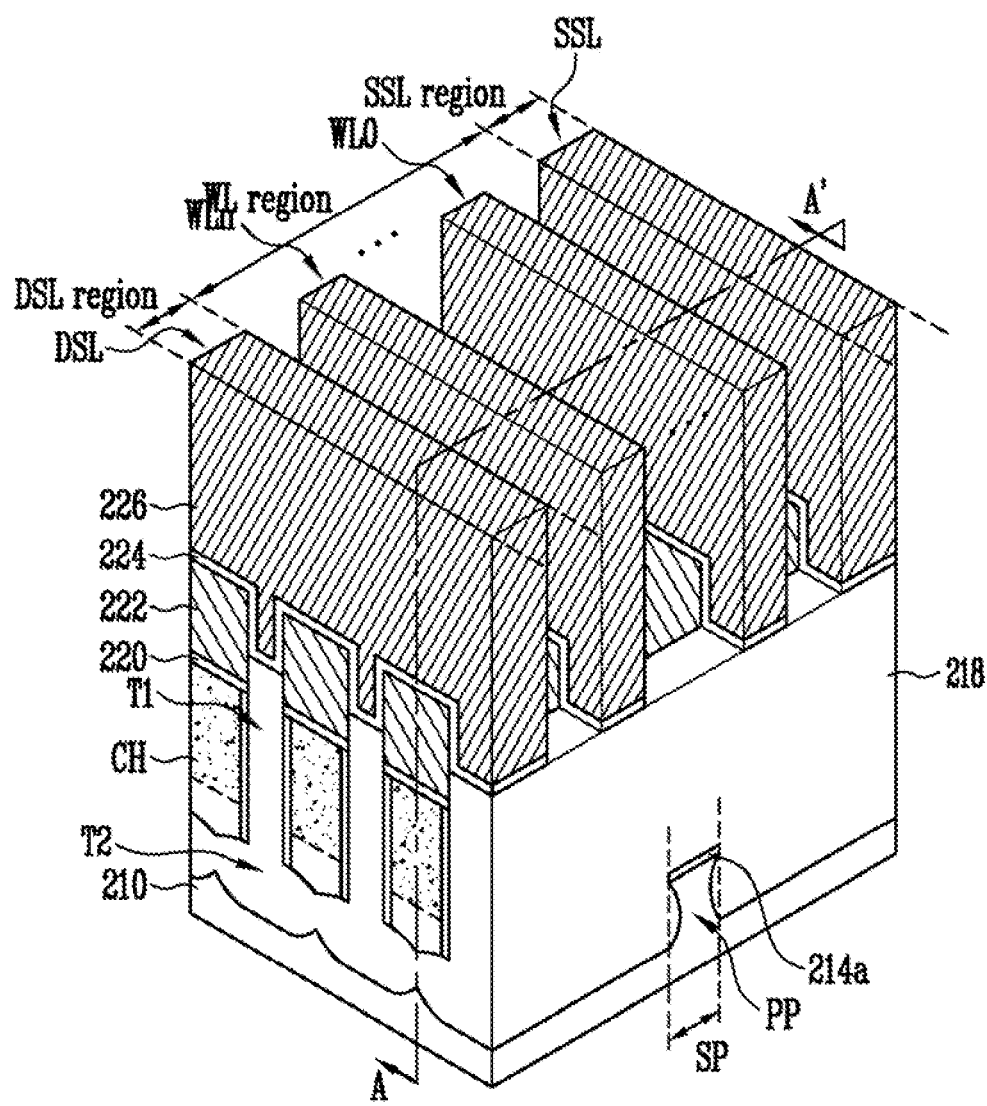

Referring to FIG. 2J, to control an effective field height (EFH) between a top surface of the isolation layer 218 formed in the isolation region ISO and a top surface of the channel region CH, an upper portion of the isolation layer 218 may be partially etched. Thereafter, a dielectric layer 224 may be formed along the surface of the entire structure, and a second conductive layer 226 for a control gate may be formed on the dielectric layer 224. For example, the dielectric layer 224 may be formed by stacking an oxide layer, a nitride layer and an oxide layer, or formed of a high-k dielectric material. The second conductive layer 226 may be formed of a doped poly-Si layer. In addition, a metal layer may be further formed on the poly-Si layer to reduce resistance of the second conductive layer 226. Thereafter, a drain select line DSL may be formed in the drain select region DSL using a gate patterning process, a plurality of word lines WL0 to WLn may be formed in the word line region WL, and a source select line SSL may be formed in the source select region SSL. Thus, a semiconductor memory device in which the second trenches T2 having a bulb shape that are connected to one another may be formed. In addition, the support layer PP may be formed using a portion of the semiconductor substrate 210 to support the channel regions CH and may prevent generation of a leakage current between the channel regions CH.

In particular, the support layer PP may be formed in the word line region WL or the source select region SSL rather than in the drain select region DSL in which a leakage current may occur. This will be described in detail with reference to the following cross-sectional views.

Figure 3A:
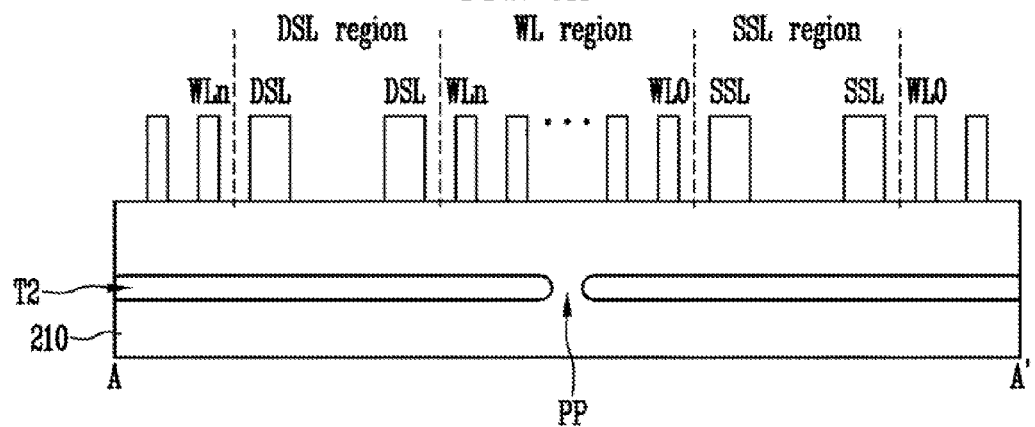
FIG. 3A is a cross-sectional view of the semiconductor memory device according to the first exemplary embodiment of the present invention.

FIG. 3A is a cross-sectional view of a semiconductor memory device according to a first embodiment of the present invention.

Referring to FIG. 3A, a cross-sectional view taken along a direction A-A' of the perspective view of FIG. 2J is shown. In the first embodiment, a support layer PP may be formed in a word line region WL of a semiconductor substrate 210, and second trenches T2 may be connected to each other in a drain select region DSL and a source select region SSL. A single support layer PP or a plurality of support layers PP may be formed in the word line region WL. For example, assuming that active regions (refer to ACT in FIG. 2A) and isolation regions (refer to ISO in FIG. 2A) are alternately defined in one direction, a support region SP may be defined in the other direction substantially crossing the active regions and the isolation regions. Even if one support layer PP or the plurality of support layers PP are formed in the word line region WL, since the second trenches T2 connected to each other under channel regions CH are formed in the drain select region DSL and the source select region SSL, a leakage current path may be cut off in the drain and source select regions DSL and SSL. Accordingly, generation of a leakage current under the channel regions CH may be prevented in the drain and source select regions DSL and SSL.

Figure 3B:
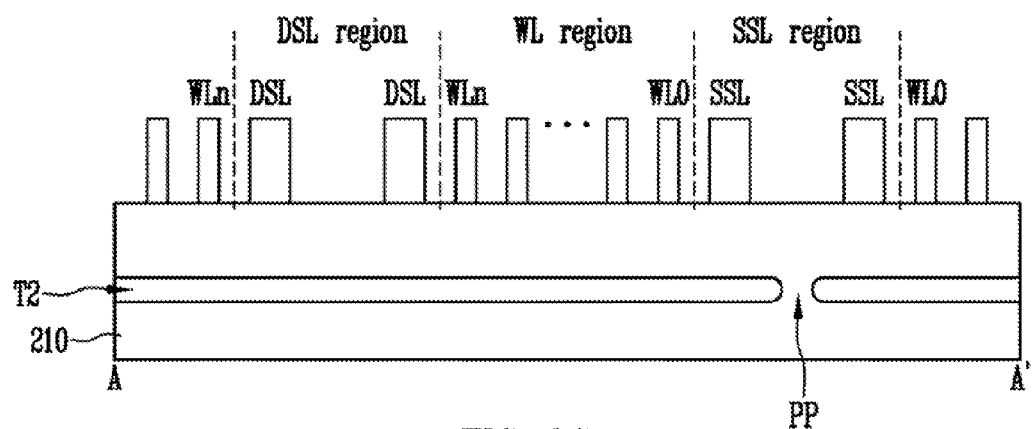
FIG. 3B is a cross-sectional view of the semiconductor memory device according to a second exemplary embodiment of the present invention.

FIG. 3B is a cross-sectional view of a semiconductor memory device according to a second embodiment of the present invention.

Referring to FIG. 3B, in the second embodiment, a support layer PP may be formed in a source select region SSL of a semiconductor substrate 210, and second trenches T2 may be connected to one another in a drain select region DSL and a word line region WL. Even if one support layer or a plurality of support layers PP are formed in the source select region SSL, since second trenches T2 connected to one another under channel regions CH are formed in the drain select region DSL and the word line region WL, a leakage current path may be cut off in the drain and word line regions DSL and WL. Accordingly, generation of a leakage current under the channel regions CH may be prevented in the drain and word line regions DSL and WL.

Figure 3C:
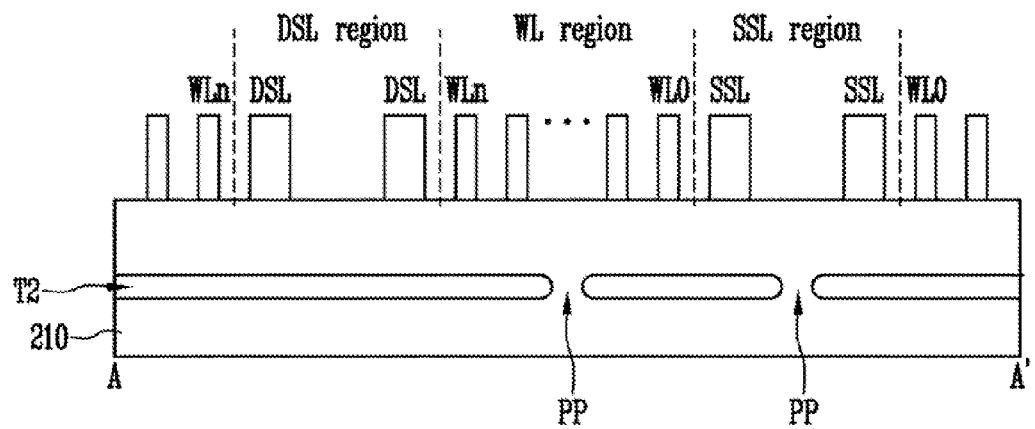
FIG. 3C is a cross-sectional view of the semiconductor memory device according to a third exemplary embodiment of the present invention.

FIG. 3C is a cross-sectional view of a semiconductor memory device according to a third embodiment of the present invention.

Referring to FIG. 3C, in the third embodiment, a support layer PP may be formed in a word line region WL and a source select region SSL of a semiconductor substrate 210, and a support layer PP may not be formed in a drain select region DSL. Even if one support layer PP or a plurality of support layers PP are formed in the word line region WL and the source select region SSL, since second trenches T2 connected to one another under channel regions CH are formed in the drain select region DSL, a leakage current path may be cut off in the drain select region DSL. Accordingly, generation of a leakage current under the channel regions CH may be prevented in the drain select region DSL.

The foregoing embodiments describe methods of manufacturing semiconductor memory devices in which the bulb-shaped second trenches T2 are formed in the word line region WL, drain select region DSL, and source select region SSL of the semiconductor substrate 210 and connected to one another, and a support layer PP is formed in at least one of the word line region WL and the source select region SSL. However, the connected second trenches T2 may be formed in regions other than the above-described word line region WL, drain select region DSL, and source select region SSL. For example, connected trenches having bulk shapes may be formed even in a peripheral circuit region so that a leakage between adjacent transistors may be prevented. In this case, the support layer PP may be formed in a region of the semiconductor substrate 210 in which no leakage occurs or a smaller leakage occurs compared to other regions, so the channel regions CH may be supported by the support layer PP.

Furthermore, although the foregoing exemplary embodiments describe a NAND flash memory device, the present invention may be applied to silicon-oxide-nitride-oxide-silicon (SONOS)-type memory devices.

Since the exemplary embodiments of the present invention may prevent generation of a leakage current between different active regions, the reliability of semiconductor memory devices may be improved.

In the drawings and specification, typical exemplary embodiments of the invention have been disclosed, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor memory device comprising:
    a semiconductor substrate in which active regions, each having a longitudinal axis, and isolation regions, each having a longitudinal axis, are alternately defined parallel to each other, and a support region is defined in a direction perpendicularly crossing the longitudinal axes of the active regions and the isolation regions;
    first trenches formed in the isolation regions;
    second trenches formed under the first trenches in the active regions and the isolation regions; and
    a support layer formed under the first trenches in the support region,
    wherein the support layer perpendicularly crosses the second trenches and separates the second trenches in the support region.

2. The device of claim 1, wherein the support layer is formed of the semiconductor substrate.

3. The device of claim 1, wherein the second trenches are formed in a bulb shape.

4. The device of claim 1, further comprising a channel region formed by implanting ions into the semiconductor substrate between the first trenches.

5. The device of claim 4, wherein the channel region has a smaller depth than the first trenches.

6. The device of claim 1, further comprising a drain select line, word lines, and a source select line formed on the semiconductor substrate.

7. The device of claim 6, wherein the support region is defined in a region in which the word lines are formed, defined in a region in which the source select line is formed, or both of the regions, respectively.

* * * * *